FREQUENCY MODULATION DETECTOR CIRCUIT SUITABLE FOR INTEGRATION IN A MONOLITHIO SEMICONDUCTOR BODY

Filed Feb. 28, 1966 2 Sheets-Sheet 1

INVENTOR.
JACK AVINS
BY Eugene M. Whitacre
Attorney

INVENTOR.
JACK AVINS
BY Eugene M. Whitacre
Attorney

United States Patent Office 3,383,607

Patented May 14, 1968

3,383,607

FREQUENCY MODULATION DETECTOR CIRCUIT SUITABLE FOR INTEGRATION IN A MONOLITHIC SEMICONDUCTOR BODY

Jack Avins, Princeton, N.J., assignor to Radio Corporation of America, a corporation of Delaware Continuation-in-part of application Ser. No. 396,178, Sept. 14, 1964. This application Feb. 28, 1966, Ser. No. 531,652

35 Claims. (Cl. 329—119)

ABSTRACT OF THE DISCLOSURE

A high performance frequency modulation detector circuit especially suited for fabrication using integrated circuit techniques, includes a predominantly resistive load network having a time constant of the order of the period or less of an applied angle modulated wave. Average detection is employed, with filtering of the signal frequency and its harmonics being provided by the distributed capacitance of the detector load resistors, with or without augmentation by the capacitance of additional reverse biased rectifiers. The detector circuit drives and provides biasing for an audio amplifier in a manner to maintain the isolation junctions reverse biased when the circuit is in integrated form.

This is a continuation-in-part of application Ser. No. 396,178, now abandoned, filed Sept. 14, 1964.

This invention relates to angle modulated wave demodulating circuits. More particularly, it relates to frequency modulation detector circuits which may be fabricated using integrated circuit techniques.

As used herein, the term "integrated circuit" refers to a unitary or monolithic semiconductor device or chip which is the equivalent of a network of interconnected active and passive circuit elements. At the present state of the art there is no satisfactory way of providing an inductor on an integrated circuit. In addition, capacitors require a large area of the integrated circuit chip even to provide a very small capacitance; and due to limitations of present fabrication techniques, capacitors may represent a potential source of trouble due to the incidence of shorting of the capacitor plates.

In considering the application of integrated circuit techniques to frequency discriminator circuits, it is apparent that the tuned phase-shift discriminator transformer will not be incorporated on the integrated circuit chip. In addition, the remainder of known discriminator circuits are not readily susceptible to fabrication using integrated circuit techniques. The reason for this is that known discriminator circuits employ peak rectification of applied signal voltages, and discriminator load networks having time constants greater than the period of the wave to be demodulated are required for this type of operation. The values of the resistors and capacitors needed to obtain such time constants in these load networks would be too large for economical incorporation on the integrated circuit chip.

It is an object of the present invention, therefore, to provide a frequency modulated detector circuit which may be fabricated using integrated circuit techniques.

As will become clear hereinafter, such fabrication is made possible by constructing the circuit as a sampling detector. Only a relatively small amount of capacitance is then required to filter the frequency modulated signal. This eliminates the necessity for the large capacitors conventionally used to obtain peak rectification. In the circuits disclosed, average detection of the applied signal voltages is employed, with filtering of the signal frequency and its harmonics being provided by the distributed capacitance of integrated resistors. This filtering may be augmented, through the use of the relatively small capacitance of reverse biased rectifier devices.

In accordance with an embodiment of the invention an integrated frequency modulation detector or discriminator circuit includes a tuned phase-shift discriminator transformer which is external to the integrated circuit chip. The discriminator transformer is connected to drive a first pair of rectifier devices formed on the integrated circuit chip. A pair of integrated load resistors are coupled to the pair of rectifier devices to form a series circuit therewith and with the secondary winding of the discriminator transformer. The load resistors and their distributed capacitance comprise the load network for the detector circuit, with the distributed capacitance providing filtering of the frequency modulated signal applied to the primary winding of the transformer and of its harmonics. The time constant of the load network is relatively short, and may be, for example, of the order of the period of the modulated carrier wave applied to the discriminator transformer.

A second pair of reverse biased rectifier devices may be coupled to the first pair of rectifier devices and to the air of integrated load resistors, if desired, to augment the distributed capacitance of these resistors so as to improve the filtering provided.

The novel features which are considered to be characteristic of this invention are set forth with particularity in the appended claims. The invention itself, however, both as to its organization and method of operation as well as additional objects and advantages thereof, will best be understood from the following description when read in connection with the accompanying drawings in which:

The integrated circuit of the invention will be described in the context of a television receiver. It is to be understood, however, that the fundamental concepts to be described are more generally applicable. For example, the circuit may be used in broadcast or communication receivers.

Figures 1, 3, 4, 5:
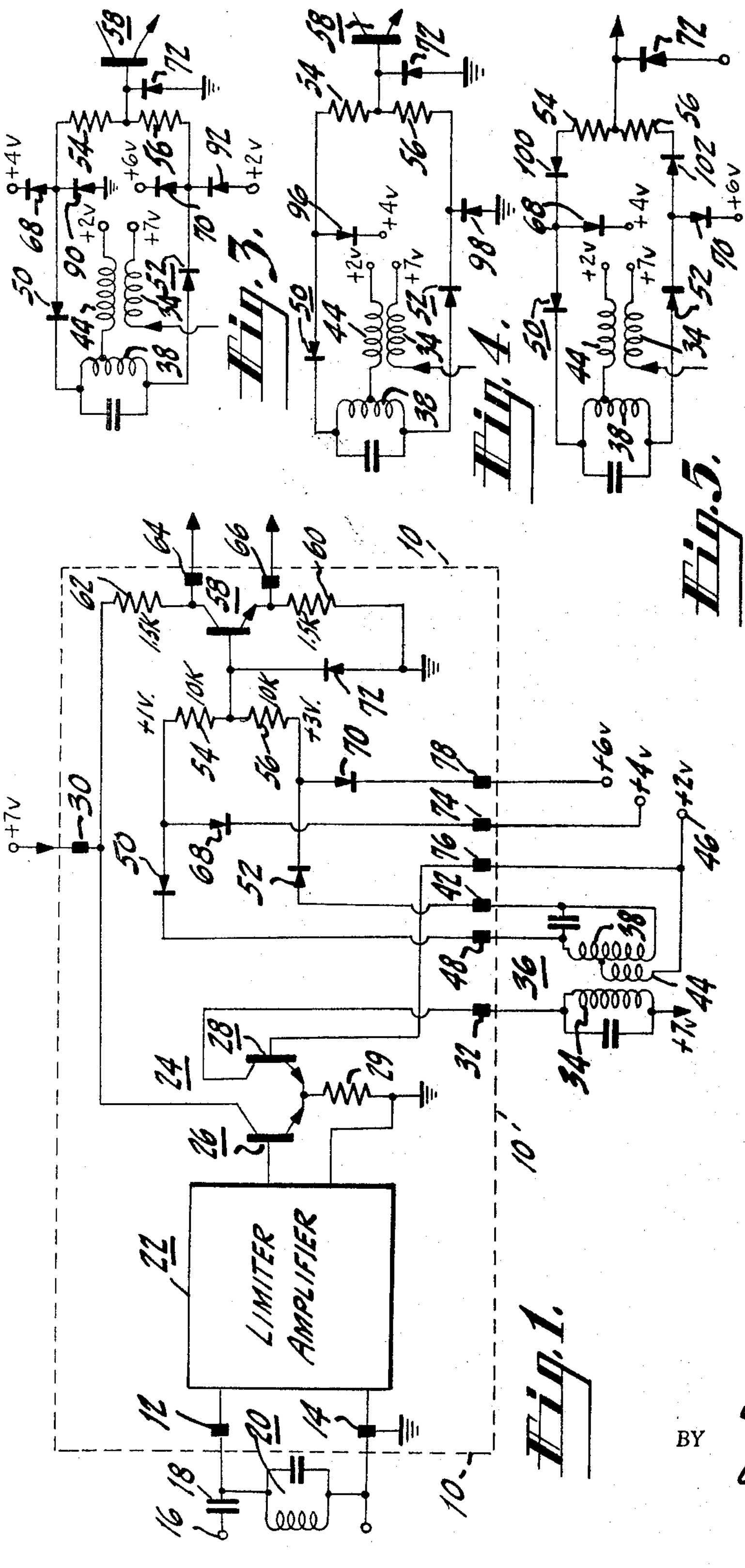
FIGURE 1 is a schematic circuit diagram of an angle modulated wave processing channel embodying the invention.
FIGURE 3 is a schematic circuit diagram of a modification of a discriminator circuit embodying the invention.
FIGURE 4 is a schematic circuit diagram of another form of discriminator circuit embodying the invention.
FIGURE 5 is a schematic circuit diagram of a further modification of a discriminator circuit embodying the invention.

The schematic circuit diagram of FIGURE 1 shows an example of specific circuitry embodying the invention. The dashed rectangle 10 schematically illustrates a monolithic semiconductor circuit chip. The chip has a plurality of contact areas about the periphery thereof through which connections to the circuit on the chip may be made. For example, the chip 10 has a pair of contact areas 12 and 14 which are coupled to a source of FM waves. The contact area 14 provides a common or ground potential contact area which is connected to the various circuit-ground connections shown on the chip. As to physical dimensions, the chip 10 may be of the order of 50 mils x 50 mils, or smaller.

FM signals from a suitable source, such as a video detector or video amplifier of a television receiver, are applied to a terminal 16 and coupled through a capacitor 18 to a resonant circuit 20 which is tuned to the 4.5 mc./s. intercarrier beat between the video and sound carriers of a television signal. The resonant circuit 20 and the coupling capacitor 18 in the present example are external to the chip, but are coupled thereto through the contact areas 12 and 14.

The contact areas 12 and 14 are coupled to a limiter amplifier 22 which is of a design susceptible to integrated circuit fabrication processes. By way of example, the circuitry incorporated in the limiter amplifier 22 may be of the type described in applications of Jack Avins, Ser. Nos. 396,140 and 396,206, filed Sept. 14, 1964, both entitled "Signal Translating System," now Patent No. 3,366,889, granted Jan. 30, 1968, and Patent No. 3,355,669, granted Nov. 28, 1967, respectively. The limiter amplifier stage 22 is connected to drive an emitter coupled amplifier-limiter stage 24 including a pair of transistors 26 and 28. The emitter electrodes of the transistors 26 and 28 are connected in common through a resistor 29 to ground. The collector electrode of the transistor 26 is connected to an operating potential supply contact area 30 which is adapted to be connected to a positive terminal of an operating potential supply source, not shown.

The collector electrode of the transistor 28 is connected through a contact area 32 to the primary winding 34 of a tuned phase-shift discriminator transformer 36. The secondary winding 38 of the discriminator transformer 36 is connected between a pair of contact areas 48 and 42, and a tertiary winding 44 is connected between a centertap on the secondary winding 38 and an operating potential supply terminal 46.

The secondary winding 38 of the discriminator transformer is connected to drive a pair of oppositely poled rectifier devices 50 and 52. A pair of load resistors 54 and 56 are connected in series between the anode of the rectifier 50 and the cathode of the rectifier 52 to form a series circuit therewith and with the secondary winding 38 of the transformer 36. The discriminator circuit demodulates applied frequency modulated signals, with the demodulated signals appearing at the junction of the resistors 54 and 56. The demodulated signals are applied to, and provide the base current drive for a transistor 58 which has equal valued emitter and collector resistors 60 and 62 respectively. The transistor 58 is connected as an audio frequency amplifier, and push-pull output signals may be derived at the contact areas 64 and 66. If desired, single-ended audio signals may be derived at one or the other of the contact areas 64 and 66.

In addition to the foregoing, the discriminator circuit includes three reverse-biased rectifier devices 68, 70 and 72. The rectifier device 68 is connected between the anode of the rectifier 50 and a contact area 74 which is adapted to be connected to a positive terminal of the operating potential supply source. The rectifier 70 is connected between the cathode of the rectifier 52 and a contact area 78 which is connected to another positive terminal of the operating potential supply source, and the rectifier 72 is connected between the base electrode of the transistor 58 and ground. A contact area 76, which is adapted to be connected to still another positive terminal of the operating potential supply source, is connected to the base electrode of the transistor 28 to provide the desired bias voltage therefor.

Before describing the operation of the FM demodulator circuit, it will be noted that the operating potential supply provides four different voltages for application to the contact areas 30, 74, 76 and 78. As indicated in FIGURE 1, these voltages are plus 7 volts, plus 4 volts, plus 2 volts and plus 6 volts, respectively each being measured with respect to ground. In addition, a reference potential point for the operating potential supply is connected to the grounded contact area 14. It is to be understood that a single operating potential supply contact area and a ground contact area may be connected to the chip, and the various voltages may be derived from a suitable tapped resistive or rectifier voltage divider formed on the chip, as described in the above noted applications.

In the operation of the circuit, amplitude limited frequency modulated waves are applied between the base electrode of the transistor 26 and ground. The emitter coupled amplifier 24 provides further limiting of the wave so that the output current in the collector circuit of the transistor 28 is essentially a square wave or a limited wave of substantially constant amplitude. The limited wave is applied through the tuned primary and secondary windings of the discriminator transformer 36 to the rectifiers 50 and 52. The load circuit for these two rectifiers comprises the resistors 54 and 56 and the reverse biased rectifiers 68 and 70 which function as small filter capacitors. The reverse biased rectifier 72 provides additional capacitance across which the demodulated audio signal is developed.

By returning the tertiary winding 44 of the discriminator transformer 36 to a positive voltage, for example plus 2 volts with respect to ground at terminal 46, the input electrodes of the rectifiers 50 and 52 are also raised to this voltage. When a signal is applied, this voltage causes current to flow through the load resistors 54 and 56 so that the same plus 2 volts appears at the junction of resistors 54 and 56 at the center signal frequency. Thus, bias voltage is provided through the discriminator network for the output amplifier transistor 58 in a balanced fashion.

An average D-C potential of about 1 volt is developed across each of the resistors 54 and 56 due to rectification of the applied carrier wave. Hence the voltage at the anode of the rectifier 70 is about 3 volts positive and the voltage at the anode of the rectifier 68 is about 1 volt positive, both with respect to ground. Since the cathodes of the rectifiers 68 and 70 are returned to plus 4 and plus 6 volts respectively, both rectifiers are reverse biased by about 3 volts. As noted above, the junction of the resistors 54 and 56 is at a potential of plus 2 volts so that the rectifier 72 is reverse biased by that amount.

Figure 6:
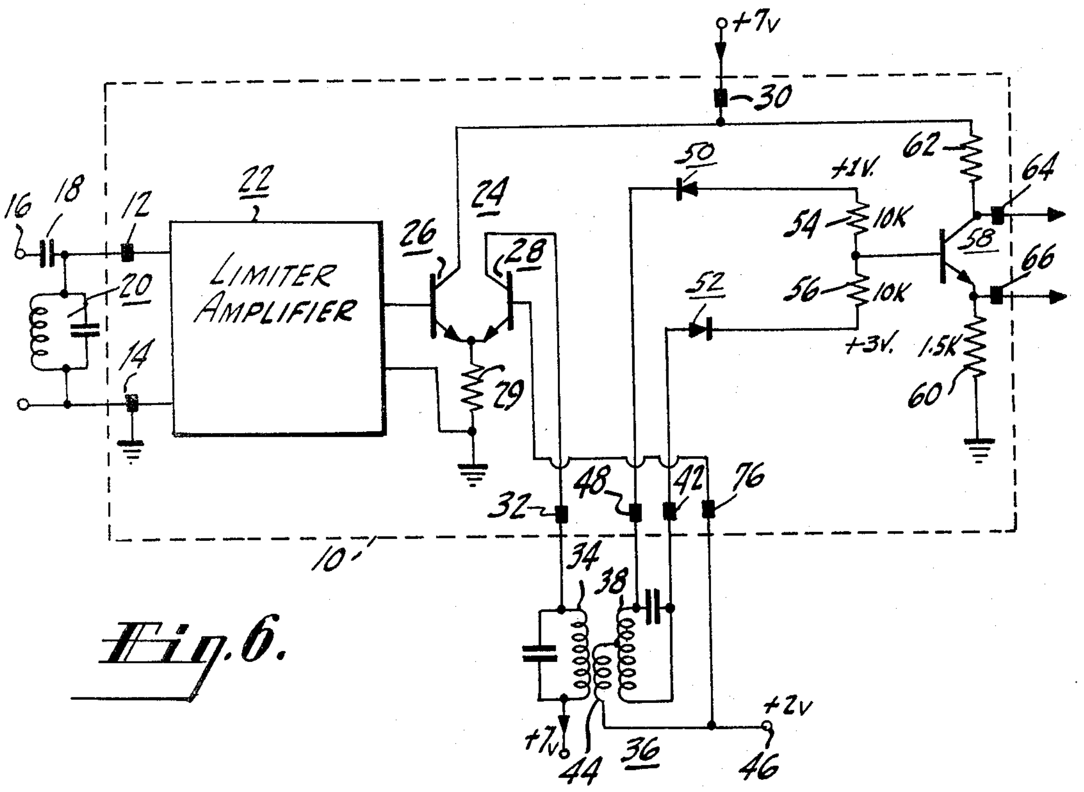
FIGURE 6 is a schematic circuit diagram of another form of angle modulated wave processing channel embodying the invention.

In the circuit of FIGURE 1, average detection is employed with a substantially resistive load. Filtering of the signal frequency and of its harmonics is provided by the distributed capacitances of the load resistors 54 and 56, and this filtering is further augmented by the capacitances provided by the reverse biased rectifiers 68, 70 and 72. In the circuit of FIGURE 6, filtering of the signal frequency and of its harmonics is provided by the distributed capacitances of the load resistors 54 and 56 without further augmentation, the reverse biased rectifiers 68, 70 and 72 being omitted from the circuit configuration.

The detection can be analyzed in terms of a switching action, wherein the junction of the resistors 54 and 56 is periodically connected to the tertiary signal voltage at the centertap of the transformer secondary winding 38. If $E_1$=peak value of the tertiary voltage;
$E_2$=peak value of the secondary voltage;
$2\phi$=angle during which the rectifiers 50 and 52 are conducting; and
$\theta$=phase shift with frequency deviation from the center frequency (resonant frequency of the tuned circuit of winding 38)

Then $$E_{AF}=\frac{1}{2\phi}\int_{-\phi}^{+\phi}E_1\sin(wt+\theta)d(wt)$$

$$=\frac{E_1}{2\phi}\Big[-\cos(wt+\phi)\Big]_{-\phi}^{+\phi}$$

$$=E_1\left(\frac{\sin\phi}{\phi}\right)\sin\theta$$

If the secondary voltage is large enough with respect to the rectifier "contact" potential to switch over 180 degrees, $$\phi=\frac{\pi}{2}$$

and $$\frac{\sin\phi}{\phi}=\frac{\pi}{2}$$

so that $$E_{AF}=\frac{2}{\pi}E_1\sin\theta$$

Under these conditions the circuit has the advantage that the demodulated output $E_{AF}$ is independent of the amplitude of the secondary voltage.

Where the secondary voltage is not large enough to overcome the rectifier "contact" potential, the switching angle is reduced and $$\frac{\sin\phi}{\phi}$$

increases. Thus, the demodulated output also increases, as shown in the following table:

| | $\phi$ | Sin $\phi/\phi$ |
|---|---|---|
| Switching Angle: | | |
| 180° | $\pi/2$ | 0.64 |
| 90° | $\pi/4$ | 0.90 |
| 45° | $\pi/8$ | 0.98 |
| 0° | 0 | 1.0 |

The effecive sensitivity of the average or sampling detector described above is increased over that of the conventional peak detector variety by virtue of its reduced loading. For an average rectifier type of detector operating into a load R, the equivalent loading reflected to the driving source is determined as follows:

$$P=\tfrac{1}{2}\frac{E^2}{R}=\frac{E^2}{(2R)}$$

where $E=RMS$ input signal $$\because \text{loading}=2R$$

In the case of a peak rectifier type of detector working into a load R shunted with a capacitor C, $$P=\frac{(\sqrt{2}E)^2}{R}=\frac{E^2}{(R/2)}$$

$$\because \text{loading}=R/2$$

Accordingly, the loading on the discriminator transformer driving source in an average detector is reduced below that of a conventional peak detector by a factor of 4 to 1.

This reduced loading is an important advantage because it can be used to make the discriminator slope sensitivity and the peak-to-peak separation substantially independent of variations in the integrated load resistors. The latter tend to vary as much as ±20% in resistance value because of variations in the present process of making the diffused resistors used in monolithic integrated circuits. In the average detector of FIGURE 1, however, the loading reflected by the diffused resistors is reduced to such a low level that it plays a negligible role in determining the discriminator characteristics. Thus, linearity and peak-to-peak separation can be maintained over the full range of resistance values. The decreased loading, in addition, makes possible higher efficiency, reduced power consumption, and greater immunity to impulse noise.

Desirable operating characteristics have been obtained in the circuit of FIGURE 1 with reverse-biased rectifiers 68, 70 and 72 providing capacitance values of 10 $\mu\mu$f. and less at frequencies as low as 0.5 mc./s., where the 0.1 $\mu$second time constant formed with the 10K resistors 54 and 56 is less than the 2 $\mu$second period of the applied signal. For a 4.5 mc./c. FM wave, the 0.1 $\mu$second time constant is of the order of the 0.2 $\mu$second signal. If external filtering of the signal frequency is employed, the reverse biased rectifiers can be eliminated. Partial filtering is provided by the distributed capacitances of the integrated resistors 54 and 56 in such a case, with further filtering being provided by the capacitance at the audio take-off point. In FIGURE 1, this includes the input capacitance of the audio amplifier transistor 58.

This use of relatively short time constant discriminator load network provides several important advantages as applied to integrated circuits. First, the very small value of capacitance required (as compared with prior art discriminator circuits) reduces or eliminates the amount of area required for capacitors on the integrated circuit chip and makes it practical to integrate the discriminator load network. Second, the reduction in reflected loading makes it possible to obtain a uniformly linear discriminator characteristic of desired peak-to-peak separation despite large production variations in the values of the diffused load resistors. Third, the large pulses of current characteristic of peak rectifier discriminator circuits can be eliminated and the harmonic radio-frequency interference which they would otherwise cause in television and communications receivers can be suppressed.

In those applications where it is desirable to use discriminator load network capacitors, the small values thereof make it convenient in integrated circuit applications to use reverse biased rectifiers to provide this capacitance. Some of the considerations which should be given to the particular circuit configuration using reverse biased rectifiers as capacitors will be better understood by reference to the diagrammatic sectional view of an integrated circuit shown in FIGURE 2. The integrated circuit chip 10, prior to processing, comprises a monocrystalline semiconductor body of a material such as silicon having P-type impurities. On one surface of the body N+ and N epitaxial layers are successively grown. During the fabrication procedure P-type isolation regions 80, 81, 82, 108 and 110 are diffused into the wafer to surround and isolate N-type areas in which rectifiers 68, 70, 72, 50 and 52 are to be formed. The anodes of the rectifiers 68, 70 and 72 are formed by diffusing a P-type impurity such as boron into appropriate locations on the separate islands of N-type material. To form a transistor, a further N-type impurity is diffused into the P-type regions as shown at 83.

Figure 2:
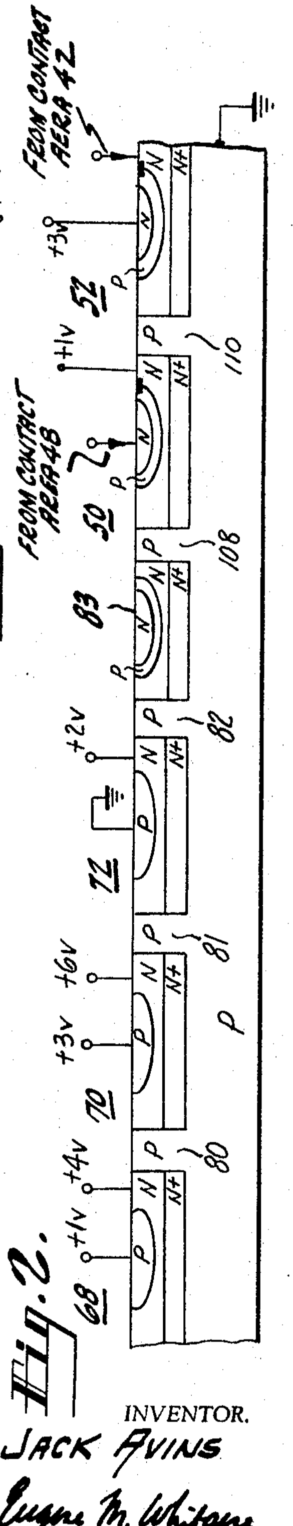
FIGURE 2 is a diagrammatic sectional view of rectifier devices formed on an integrated circuit chip.

To minimize the effect of parasitics, it is desirable to fabricate the rectifiers 50 and 52 from a transistor structure similar to that shown by 83 in FIGURE 2 rather than from the diode structure shown in 68, 70 or 72. The collector region and the corresponding base region of the transistor structure are connected to each other to form the anode of the rectifier while the emitter region forms the cathode of the rectifier. This form of rectifier suppresses parasitic transistor action in which the substrate may take part as an active element.

A feature of operating the discriminator network of FIGURE 1 at a positive potential with respect to the grounded substrate (through the tertiary winding 44) is that the various isolation junctions are maintained in a reverse biased condition. They are therefore effective in their isolation function even when signal voltages are applied. Consider rectifier 52, for example. Its anode (N) is adjacent to the grounded substrate (P) in FIGURE 2, this boundary forming the isolation junction 110 which must be maintained in a reverse biased condition for the isolation to be effective. If the signal voltage applied to the transformer drives the anode of rectifier 52 negatively with respect to the substrate on the peaks of the input signal, the isolation junction will become forward biased. This in turn will short circuit the lower half of the secondary winding 38 and unbalance the discriminator. This undesirable action is avoided by raising the average potential of the secondary 38 (and, therefore, the average potential of the anode of rectifier 52) by the amount of the injected D-C bias, in this case plus 2 volts. This makes it possible to accommodate a signal at the secondary 38 of at least two volts peak without forward biasing the isolation junction.

Where the integrated circuit chip includes a P-type substrate, as shown in FIGURE 2, connection of the cathodes (N-type region) of the rectifiers 68 and 70 through the power supply to reference potential reduces the amount of R-F currents fed into the substrate because both the rectifier cathode and the adjacent P-type substrate are at signal ground potential. By reducing the amount of current fed into the substrate, feedback problems to other circuits on the chip are reduced.

In the case of the rectifier device 72, the connection of the cathode of the device to the junction of the resistors 50 and 54 provides an advantage in that the rectifier exhibits an enhanced capacitance. This will be understood by reference to FIGURE 2 wherein it will be noted that in addition to the junction capacitance between the P and N regions of the rectifier 72, there is additional capacitance existing between the N region of the rectifier 72 and the P-type substrate. These two capacitances are effectively connected in parallel and hence provide a greater overall capacitance than would be exhibited if the poling of the rectifier 72 were reversed.

If desired, the rectifiers of the discriminator load network may be oppositely poled as shown in FIGURE 4. In this embodiment of the invention the anode of the rectifier 96 is connected to the anode of the rectifier 50 and the cathode of the rectifier 96 is connected to the plus 4 volt terminal of the operating potential supply. The anode of the rectifier 98 is grounded and its cathode is connected to the cathode of the rectifier 52. Since the rectifier 98 exhibits more capacitance than the rectifier device 96, assuming equal junction areas, the network will tend to be unbalanced. Accordingly, the junction areas of the rectifier 96 is made sufficiently large with respect to the junction area of the rectifier 98 so that the mean capacitance of the rectifiers 96 and 98 are substantially equal.

In this regard, the discriminator rectifiers 50 and 52 should be fabricated in a manner to provide a relatively small junction area to prevent unbalance of the discriminator. As noted above, there is more capacitance from the cathodes of the various rectifiers to the integrated circuit chip substrate than from their anodes. Accordingly, there is effectively more capacitance-to-ground from the cathode of the rectifier 52 than from the anode of the rectifier 50. This inequality may be overcome by making the relative sizes of the junctions of the rectifiers 96 and 98 such that the total mean capacitances from (1) the anode of the rectifier 50 to ground; and (2) from the cathode of the rectifier 52 to ground are of the same value. The same principle may be used to balance the load network capacitances of the discriminator circuits of FIGURES 1 and 3.

The loading on the discriminator transformer primary winding 34 may be further reduced from that described above in connection with FIGURE 1 by the provision of a pair of series rectifiers 100 and 102 as shown in FIGURE 5. The rectifier 100 is poled in the same direction as the rectifier 50, and the rectifier 102 is poled in the same direction as the rectifier 52. Since the rectifiers are formed of silicon material there is a "delay" voltage of about 0.65 volt in the forward direction before substantial diode 100 and 102 conduction is effected. As a result, less current is drawn by the discriminator network, and correspondingly less of a load is reflected to the discriminator transformer windings.

The circuit of FIGURE 5 is preferably not used to directly drive a transistor such as the transistor 58 shown in FIGURES 1, 3 and 4 because the transistor 58 bias current is derived from signal power.

Figure 7:
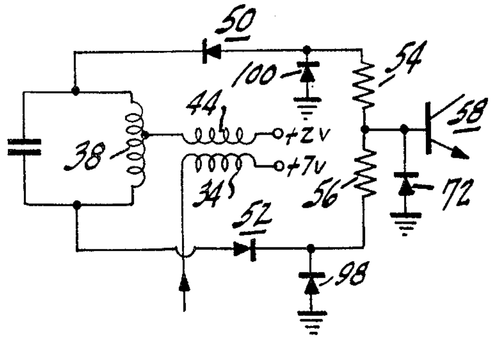
FIGURE 7 is a schematic circuit diagram of still another form of discriminator circuit embodying the invention.

If desired, the rectifiers of the discriminator load network may be poled as shown in FIGURE 7. In this embodiment of the invention the cathode of the rectifier 100 is connected to the anode of the rectifier 50 and the anode of the rectifier 100 is connected to ground. The anode of the rectifier 98 is also grounded and its cathode is connected to the cathode of the rectifier 52. With this connection, the capacitance of each reverse-biased rectifier 100 and 98 is augmented by the capacitance of the cathodes to the substrate so that less area is used on the chip for a given capacitance. Since the polarizing voltage is smaller for rectifier 100, its capacitance will be larger than that of 98, and therefore its area can be less than that of rectifier 98 in order to equalize the capacitances.

In the circuits shown in FIGURES 1 and 3–7, the plus 2 volt bias voltage is applied to the tertiary winding 44 and the demodulated output is taken off at the junction of the two load resistors 54 and 56. Because of the series nature of the circuit, these two positions can be interchanged so that the bias voltage is applied at the junction of the two load resistors and the demodulated output is taken off at point 102 on the tertiary winding 44. This is shown in FIGURE 8.

Figure 8:
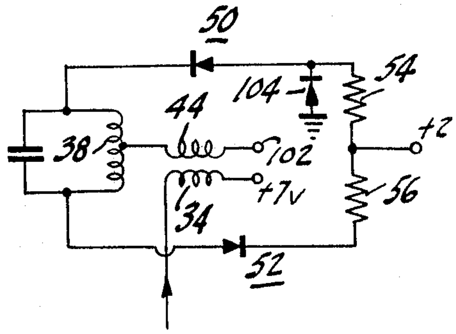
FIGURE 8 is a schematic circuit diagram of a further modification of a discriminator circuit embodying the invention.

FIGURE 8 also illustrates the equalization of the load capacitances previously referred to—the greater capacitance to ground of the cathode of rectifier 52 (as compared to that of the anode of rectifier 50) is compensated for by the addition of reverse-biased rectifier 104 of such capacitance as to effect the desired equalization. This equalization is particularly desirable at high frequencies where the reactance of the unbalance capacitances is not negligible in comparison with the resistance of the load resistors. For example, at 50 mc./s., the reactance of a 1 $\mu\mu$f. unbalance capacitance is 3200 ohms, which is even smaller than the load resistors 54 and 56. If this unbalance is not compensated, the crossover point of the discriminator characteristic is offset from the center and the amplitude modulation suppression and linearity characteristics are impaired. On the other hand, at lower frequencies, the reactance of the unbalance capacitance is sufficiently high so that the reverse biased rectifier 104 in FIGURE 8 can be omitted.

Although FIGURES 1 and 3–8 show transformer 36 as having a separate tertiary winding 44, it will be readily apparent to one skilled in the art that this winding can be eliminated by connecting the "hot" side of the primary winding 34, or a tap thereon, directly to the centertap on the secondary winding 38. The positive voltage for the discriminator network is then obtained directly from the winding 34.

What is claimed is:

1. An angle modulated wave demodulating system comprising:

a frequency discriminator transformer having a secondary winding and a point thereon to which angle modulated waves are applied;

a pair of rectifiers coupled to said winding; and a load network coupled to said rectifiers to form a series connected circuit therewith and with at least a portion of said secondary winding to provide demodulation of said applied angle modulated waves, the load network having a resistor and a capacitive impedance element in parallel therewith, the time constant of said resistor and said element not exceeding the order of the period of an applied angle modulated wave.

2. An angle modulated wave demodulating system as defined in claim 1 wherein the time constant of said resistor and said element is of the order of the period of an applied angle modulated wave.

3. An angle modulated wave demodulating system as defined in claim 1 wherein the time constant of said resistor and said element is less than the period of an applied angle modulated wave.

4. An angle modulated wave demodulating system as defined in claim 1 wherein said capacitive impedance element comprises the distributed capacitance of said resistor.

5. An angle modulated wave demodulating system comprising:

means providing first and second input circuit for supplying angle modulated waves of the same phase and frequency;

first and second rectifiers;

load means;

means connecting said first and second input circuits, said first rectifier, said load means, and said second rectifier in the order named in a circuit loop, the time constant of said circuit loop being such as to cause conduction of said rectifiers over the greater portion of alternate half cycles at the center frequency of said angle modulated waves;

an output circuit;

means providing a third input circuit for supplying angle modulated waves which, at the center frequency, are in phase quadrature with the angle modulated waves provided by said first and second input circuits, and which varies in phase with respect to said first and second angle modulated waves as a function of the angle modulation of said waves;

and means connecting said output circuit and said third input circuit in series between the junction of said first and second input circuits and said load means.

6. An angle modulated wave demodulating system as defined in claim 5 wheerein said load means consists of a resistive network.

7. An angle modulated wave demodulating system as defined in claim 5 wherein said load means comprises first and second load resistors.

8. An angle modulated wave demodulating system as defined in claim 7 wherein said output circuit and said third input circuit are connected in series between the junction of said first and second input circuits and the junction of said first and second resistors.

9. An angle modulated wave demodulating system as defined in claim 5 wherein said first and second input circuits comprise the respective portions of a tapped secondary winding of a discriminator transformer, wherein said third input circuit comprises a tertiary winding of said transformer, and wherein said first and second rectifiers are poled in the same direction for forward current flow around said circuit loop.

10. An angle modulated wave demodulating system as defined in claim 5 wherein there is also included a source of direct potential connected in series with said third input circuit and said output circuit, and wherein said output circuit includes a transistor amplifier connected for biasing by said source of direct potential.

11. An angle modulated wave demodulating system as defined in claim 5 wherein said first and second input circuits comprise the respective portions of a tapped secondary winding of a discriminator transformer and wherein said third input circuit comprises the primary winding of said transformer.

12. An angle modulated wave demodulating system as defined in claim 8 wherein there is also included in third and fourth rectifiers, means connecting said third and fourth rectifiers across said first and second resistors, and means for reverse biasing said third and fourth rectifiers.

13. An angle modulated wave demodulating system as defined in claim 8 wherein said output circuit is connected between the junction of said first and second load resistors and a point of reference potential, and wherein there is also included a third rectifier connected in parallel with said output circuit and means for reverse biasing said third rectifier.

14. An angle modulated wave demodulating system comprising:

a frequency discriminator transformer having a primary winding, a secondary winding including a tap, and a tertiary winding connected at one end to said tap to apply angle modulated waves thereto;

a pair of rectifier devices, each having an anode and a cathode electrode;

a first direct current connection from the cathode electrode of one of said pair of rectifier devices to one terminal on said secondary winding;

a second direct current connection from the anode electrode of the other of said pair of rectifier devices to another terminal on said secondary winding;

resistance means completing the path between the anode of said one rectifier device and the cathode of said other rectifier device to provide demodulation of said angle modulated waves;

and an output circuit connected to one of said resistance means and the other end of said tertiary winding.

15. An angle modulated wave demodulating system comprising:

a discriminator transformer having a primary winding, a center tapped secondary winding and a tertiary winding;

first and second rectifiers;

first and second resistors;

means connecting the anode of said first rectifier to one terminal of said secondary winding;

means connecting the cathode of said second rectifier to the other terminal of said secondary winding;

means connecting said first and second resistors in series between the cathode of said first rectifier and the anode of said second rectifier;

means connecting said tertiary winding between the tap on said secondary winding and a first point of reference potential;

third and fourth rectifiers connected respectively in parallel with said first and second resistors;

a fifth rectifier connected between the junction of said first and second resistors and a second point of reference potential;

means for reverse biasing said third, fourth and fifth rectifiers;

a transistor having a base electrode and an emitter electrode;

means directly connecting said base electrode to the junction of said first and second resistors;

and means connecting said emitter electrode to said second point of reference potential.

16. An angle modulated wave demodulting system as defined in claim 15 wherein there is also included a source of direct potential connected between said tertiary winding and said second point of reference potential for biasing the base and emitter electrodes of said transistor.

17. An integrated circuit device for use in angle modulated wave demodulating circuits comprising:

a body of semiconductor material of a first conductivity type having islands of semiconductor material of a second conductivity type in said body;

regions of semiconductor material of at least said first conductivity type in said islands to provide at least one rectifying junction in each island thereof;

resistance means formed on said semiconductor body;

first and second terminals on said body for connection to a source of angle modulated waves;

means on said body for connecting a first rectifying junction of one island, said resistance means and a second rectifying junction of a second island, in series between said terminals; and a third terminal on said body connected to said resistance means.

18. An integrated circuit device as defined in claim 17 wherein said resistance means includes a pair of resistors and wherein said third terminal is connected to the junction of said resistors.

19. An integrated circuit device as defined in claim 18 in which there is also included a fourth terminal, and a third rectifying junction of a third island connected between the junction of said pair of resistors and said fourth terminal.

20. An integrated circuit device as defined in claim 19 wherein the island of said second conductivity type of said first rectifying junction is connected to said first terminal, the region of said first conductivity type of said second rectifying junction is connected to said second terminal, and the island of said second conductivity type of said third rectifying junction is connected to the junction between said first and second resistors.

21. An integrated circuit device as defined in claim 20 wherein there is also included fourth and fifth rectifying junctions of fourth and fifth islands, additional terminal means, means on said body connecting said fourth rectifying junction between said additional terminal means and the common connection between said first resistor and said first rectifying junction, and means on said body connecting said fifth rectifying junction between said additional terminal means and the common connection between said second resistor and said second rectifying junction.

22. An integrated circuit device as defined in claim 20 wherein there is also included fourth and fifth rectifying junctions of fourth and fifth islands, means on said body connecting said fourth rectifying junctions between said fourth terminal and the common connection between said first resistor and said first rectifying junction, and means on said body connecting said fifth rectifying junction between said fourth terminal and the common connection between said second resistor and said second rectifying junction.

23. An integrated circuit device as defined in claim 21 wherein the sides of said fourth and fifth rectifying junctions connected to said additional terminal means are of like conductivity type.

24. An integrated circuit device as defined in claim 21 wherein the sides of said fourth and fifth rectifying junctions connected to said additional terminal means are of said second conductivity type.

25. An integrated circuit device as defined in claim 21 wherein the sides of said fourth and fifth rectifying junctions connected to said additional terminal means are of said first conductivity type.

26. An integrated circuit device as defined in claim 21 wherein the sides of said fourth and fifth rectifying junctions connected to said additional terminal means are of opposite conductivity type.

27. An integrated circuit device as defined in claim 21 wherein the areas of said fourth and fifth rectifying junctions are dissimilar.

28. An integrated circuit device as defined in claim 21 wherein the areas of said fourth and fifth rectifying junctions are of different sizes respectively to present substantially the same total circuit capacitance across said first and said second resistors.

29. An integrated circuit device for use in angle modulated wave demodulating circuits of the type including a discriminator transformer comprising:

a body of semiconductor material of a first conductivity type having first and second islands of semiconductor material of a second conductivity type in said body;

a first region of semiconductor material of said first conductivity type in each of said first and second islands to provide a first rectifying junction therein, with said island providing a first side of said first rectifying junction and with said first region providing the second side of said first rectifying junction;

a second region of semiconductor material of said second conductivity type in said first region of semiconductor material in each of said first and second islands to provide a second rectifying junction therein, with said first region providing a first side of said second rectifying junction and with said second region providing the second side of said second rectifying junction;

means on said body connecting said island material and said first region material in each of said first and second islands to provide a first composite rectifying junction in said first island and a second composite rectifying junction in said second island, with said island and said first region providing a first side of each of said composite rectifying junctions and with said second region providing the second side of each of said composite rectifying junctions;

resistance means formed on said semiconductor body;

means on said body providing first and second terminals for connection to said discriminator transformer;

means on said body for connecting said first composite rectifying junction, said first and said second resistors, and said second composite rectifying junction in series between said pair of terminals;

and a third terminal on said body connected to said resistance means.

30. In angle modulated wave demodulating circuits of the type including a discriminator transformer having a secondary winding, the combination comprising:

a body of semiconductor material of a first conductivity type having islands of semiconductor material of a second conductivity type in said body, each of said islands forming an isolation junction with said body;

regions of semiconductor material of said first conductivity type in said islands to provide at least one rectifying junction in each island thereof;

resistance means formed on said semiconductor body;

first and second terminal means on said body for connection to the secondary winding of said discriminator transformer;

further means on said body for connecting a rectifying junction of one island, said resistance means and a rectifying junction of a second island, in series between said terminal means;

a third terminal on said body connected to said resistance means;

and means for applying a potential between said body and said first and second terminals of a polarity to reverse bias said isolation junctions.

31. The combination as defined in claim 30 wherein the island of said second conductivity type of a first rectifying junction is connected to said first terminal means, and the region of said first conductivity type of a second rectifying junction is connected to said second terminal means.

32. The combination as defined in claim 31 wherein said resistance means includes a pair of resistors and wherein said third terminal is connected to the junction of said resistors.

33. The combination as defined in claim 32 wherein there is also included a fourth terminal on said body and a rectifying junction of a third island connected between the junction of said pair of resistors and said fourth terminal, and wherein the island of said second conductivity type of said third rectifying junction is connected to the junction between said first and second resistors.

34. The combination as defined in claim 32 wherein there is also included a region of semiconductor material of said second conductivity type in a region of semiconductor material of said first conductivity type in an additional one of said islands, wherein the region of said first conductivity type of said additional island is connected to the junction of said pair of resistors, and wherein said third terminal is connected to one of said additional island and said region of said second conductivity type of said additional island.

35. An integrated circuit device for use in angle modulated wave demodulating system comprising:

a body of semiconductor material of a first conductivity type having first, second, third, fourth and fifth islands of semiconductor material of a second conductivity type in said body;

regions of semiconductor material of said first conductivity type in said islands to provide one rectifying junction in each island thereof;

first and second resistors formed on said semiconductor body;

means on said body for connecting said resistors;

first and second terminals on said body for connection to a source of angle modulated waves;

a third terminal on said body for connection to a source of reference potential;

means on said body for connecting a region of said first conductivity type of said first island to said first resistor;

means on said body for connecting said first island to said first terminal;

means on said body for connecting said second island to said second resistor;

means on said body for connecting a region of said first conductivity type of said second island to said second terminal;

means on said body for connecting a region of said first conductivity type of said third island to said third terminal;

means on said body for connecting said third island to the junction of said first and second resistors;

means on said body for connecting a region of said first conductivity type of said fourth island to said third terminal;

means on said body for connecting said fourth island to the junction of said region of first conductivity type of said first island with said first resistor;

means on said body for connecting a region of said first conductivity type of said fifth island to said third terminal;

means on said body for connecting said fifth island to the junction of said second island with said second resistor;

and a fourth terminal on said body for connection to the junction of said first and second resistors.

References Cited

UNITED STATES PATENTS

| | | | |
|---|---|---|---|
| 2,561,089 | 7/1951 | Anderson | 329—130 |
| 2,915,631 | 12/1959 | Nilssen | 329—129 |
| 3,047,813 | 7/1962 | Danker | 329—129 |
| 3,170,121 | 2/1965 | Ho et al. | 329—240 X |
| 3,290,608 | 12/1966 | Gschwandtner | 329—103 |
| 2,901,612 | 8/1959 | Dwork et al. | 329—134 X |
| 3,191,151 | 6/1965 | Price | 307—88.5 |
| 3,193,741 | 7/1965 | McGivern | 307—88.5 |
| 3,288,656 | 11/1966 | Nakamura | 307—88.5 |

FOREIGN PATENTS

| | | |
|---|---|---|
| 640,348 | 4/1962 | Canada. |

ALFRED L. BRODY, *Primary Examiner.*

UNITED STATES PATENT OFFICE
CERTIFICATE OF CORRECTION

Patent No. 3,383,607 May 14, 1968

Jack Avins

It is certified that error appears in the above identified patent and that said Letters Patent are hereby corrected as shown below:

Column 2, line 24, "air" should read -- pair --. Column 5, line 9, "$\frac{\pi}{2}$" should read -- $\frac{2}{\pi}$ --; line 33, "effecive" should read -- effective --. Column 9, line 3, "circuit" should read -- circuits --.

Signed and sealed this 16th day of December 1969.

(SEAL)
Attest:

Edward M. Fletcher, Jr.
Attesting Officer

WILLIAM E. SCHUYLER, JR.
Commissioner of Patents